US010042242B2

(12) United States Patent
Mizoshita

(10) Patent No.: US 10,042,242 B2
(45) Date of Patent: Aug. 7, 2018

(54) TRANSPARENT SCREEN AND METHOD FOR MANUFACTURING TRANSPARENT SCREEN

(71) Applicant: ARC CO., LTD., Fukuoka (JP)

(72) Inventor: Kosuke Mizoshita, Fukuoka (JP)

(73) Assignee: ARC CO., LTD., Suga-Machi, Kokurakita-Ku, Kitakyushu-Shi, Fukuoka (JP)

( * ) Notice: Subject to any disclaimer, the term of this patent is extended or adjusted under 35 U.S.C. 154(b) by 0 days.

(21) Appl. No.: 15/531,711

(22) PCT Filed: Dec. 24, 2015

(86) PCT No.: PCT/JP2015/086009
§ 371 (c)(1),
(2) Date: May 30, 2017

(87) PCT Pub. No.: WO2016/108273
PCT Pub. Date: Jul. 7, 2016

(65) Prior Publication Data
US 2017/0336704 A1 Nov. 23, 2017

(30) Foreign Application Priority Data

Dec. 29, 2014 (JP) ................................ 2014-267054

(51) Int. Cl.
*G03B 21/62* (2014.01)
*B41F 15/08* (2006.01)
*C23C 16/44* (2006.01)

(52) U.S. Cl.
CPC .......... *G03B 21/62* (2013.01); *B41F 15/0804* (2013.01); *C23C 16/44* (2013.01)

(58) Field of Classification Search
CPC ..................................................... G03B 21/62
(Continued)

(56) References Cited

U.S. PATENT DOCUMENTS

| 4,567,082 A * | 1/1986 | Tabata ............... B60K 37/00 428/138 |
| 7,184,209 B2 * | 2/2007 | Simonsen .............. G03B 21/56 353/46 |

(Continued)

FOREIGN PATENT DOCUMENTS

| JP | 63-172259 A | 7/1988 |
| JP | 2000-305179 A | 11/2000 |

(Continued)

*Primary Examiner* — Christopher Mahoney
(74) *Attorney, Agent, or Firm* — Heedong Chae; Lucem, PC

(57) ABSTRACT

An object is to provide a transparent screen which can clearly project and display an image without degradation of transmission visibility and a method for manufacturing the transparent screen.
A thin film 4 in which a large number of regular hexagonal hole portions 3 that are identical to each other are opened, in a transparent sheet 2, in a web-like manner is applied to a transparent screen 1. The regular hexagonal hole portions 3 are segmented with web-like line portions 6 formed by connecting the sides 5 of the adjacent regular hexagonal hole portions 3 so as to have an even width, image light projected from a projector 7 is reflected off the web-like line portions 6 and is shown on the transparent screen 1 and a background on the back surface side of the transparent screen 1 can be visually recognized through the regular hexagonal hole portions 3.

5 Claims, 7 Drawing Sheets

(58) Field of Classification Search
USPC .......................................... 359/460; 428/135
See application file for complete search history.

(56) References Cited

U.S. PATENT DOCUMENTS

| | | | |
|---|---|---|---|
| 2002/0109920 A1* | 8/2002 | Hannington | G02B 5/021 |
| | | | 359/614 |
| 2008/0008854 A1* | 1/2008 | Arai | B23K 26/067 |
| | | | 428/135 |
| 2013/0330486 A1 | 12/2013 | Shields | |

FOREIGN PATENT DOCUMENTS

| | | |
|---|---|---|
| JP | 2006-106135 A | 4/2006 |
| JP | 2006-119489 A | 5/2006 |
| JP | 2008-076783 A | 4/2008 |
| JP | 2014-013369 A | 1/2014 |
| JP | 2014-206706 A | 10/2014 |

* cited by examiner

[Fig. 1]
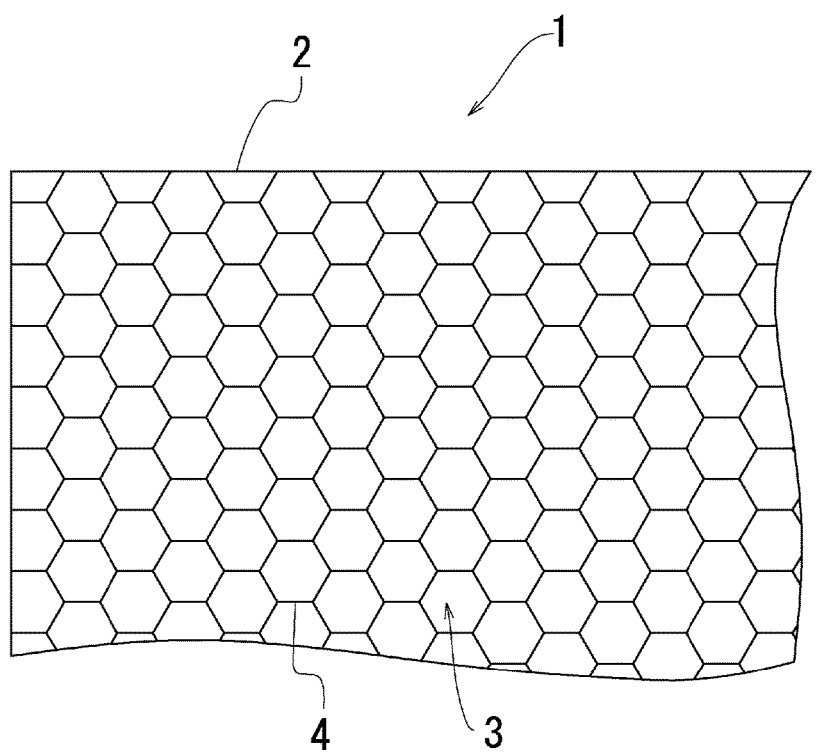

[Fig. 2]
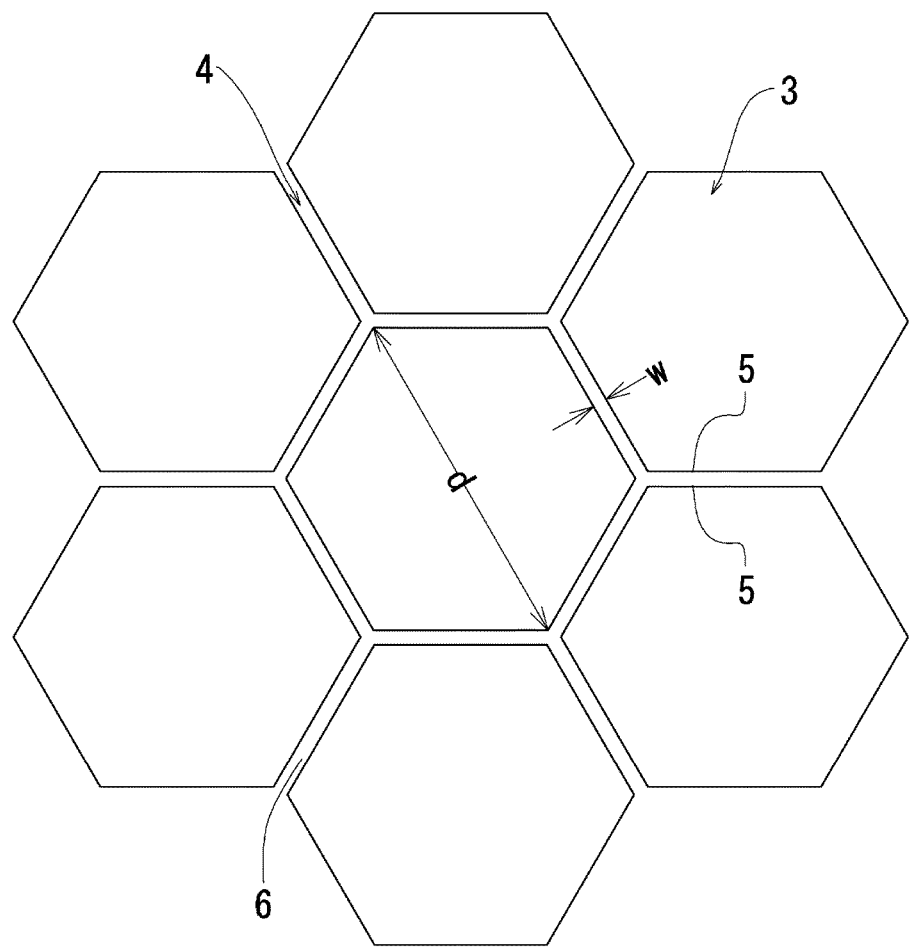

[Fig. 3]
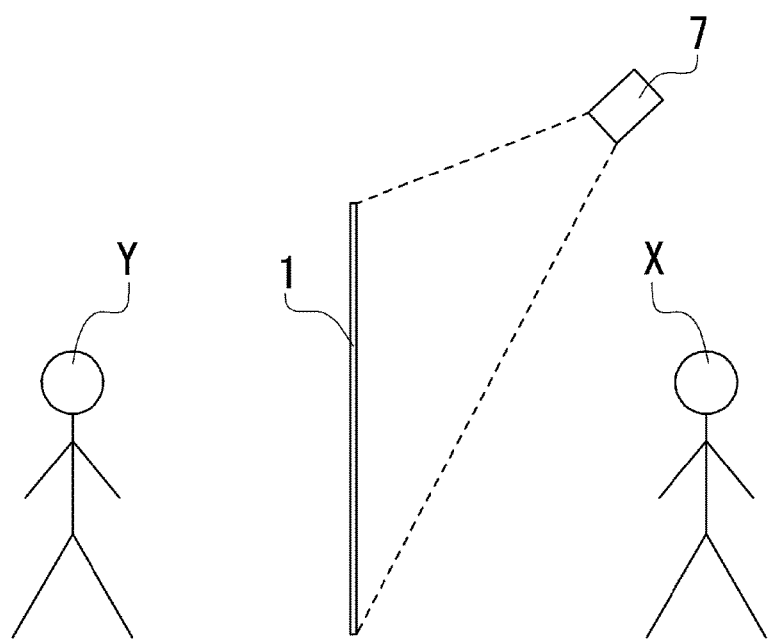

[ Fig. 4(a)]
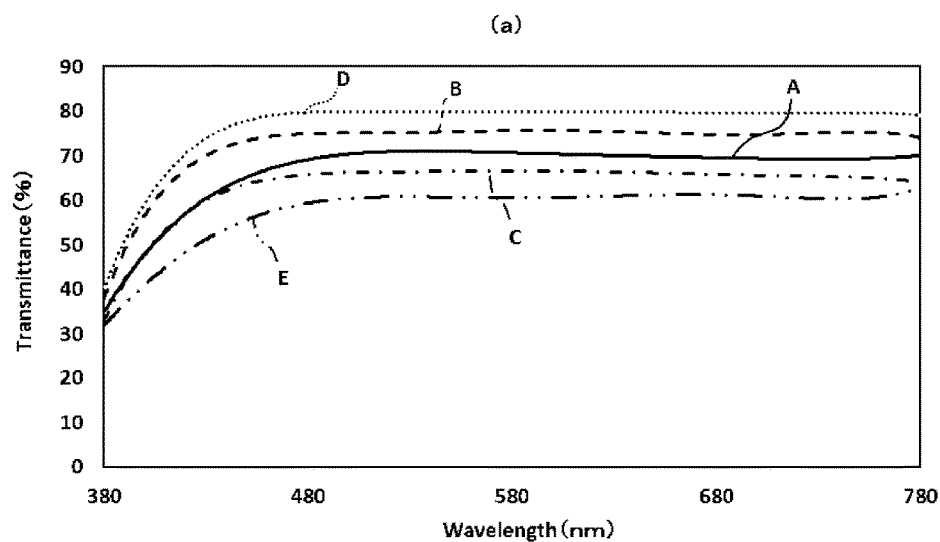
[ Fig. 4(b)]
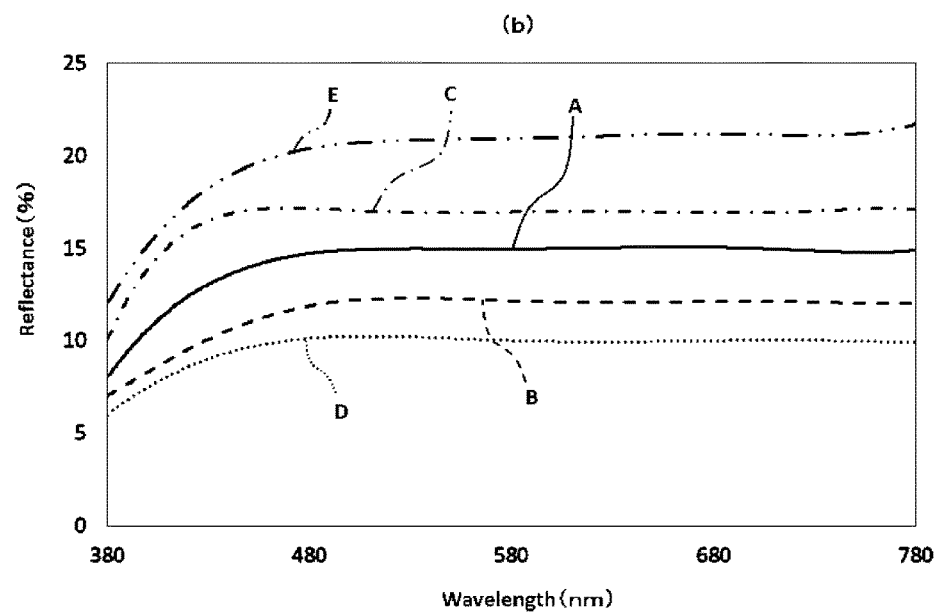

[Fig. 5]
(a)
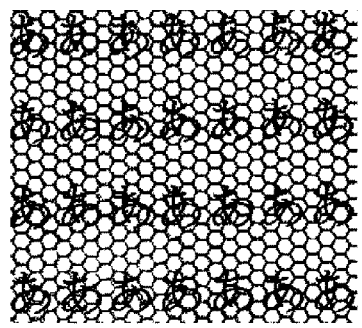
(b)
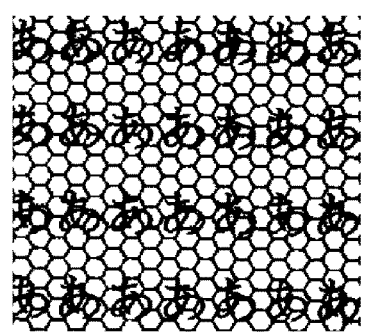
(c)
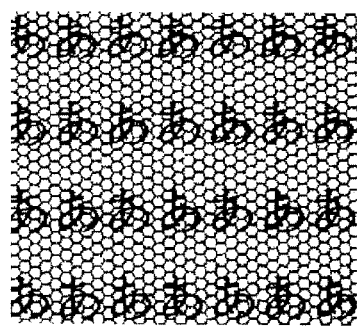
(d)
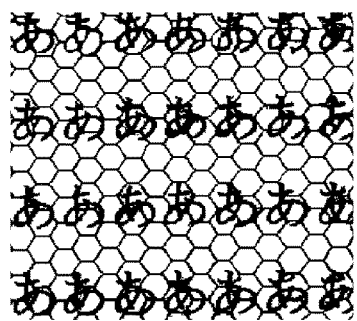
(e)
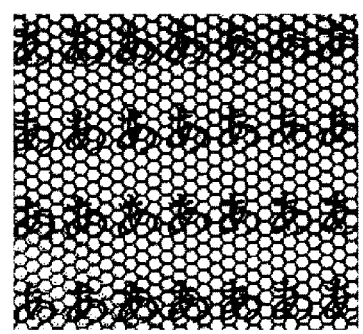

[ Fig. 6 ]
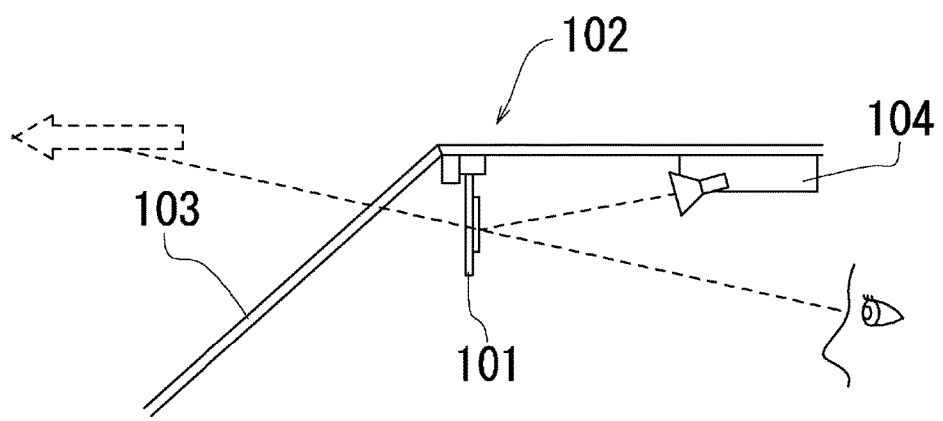

[Fig. 7]
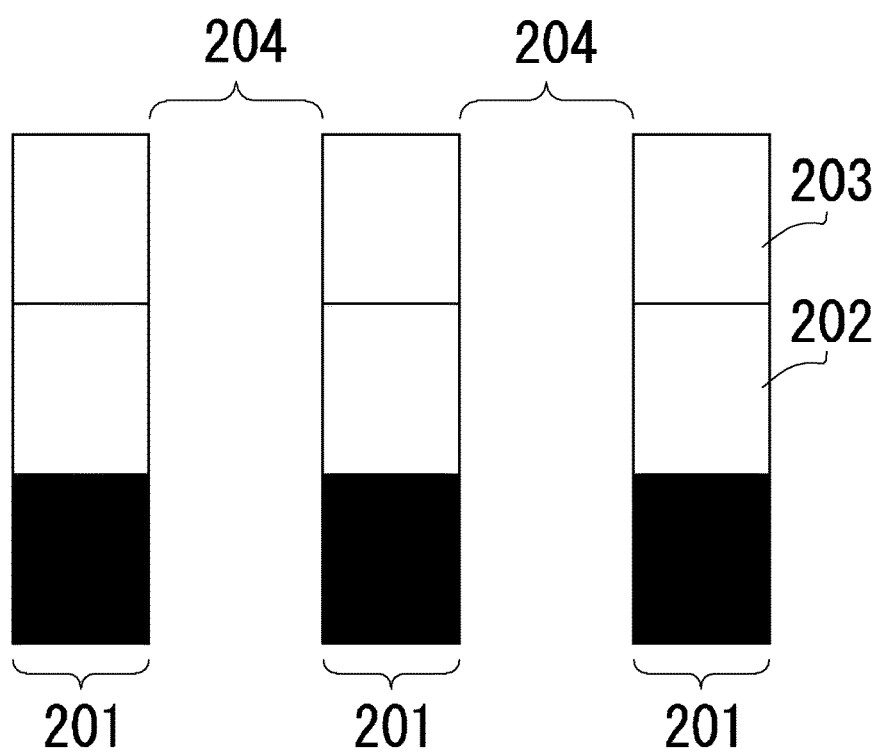

TRANSPARENT SCREEN AND METHOD FOR MANUFACTURING TRANSPARENT SCREEN

CROSS-REFERENCE TO RELATED APPLICATION

This application claims the benefit of Japanese Application No. 2014-267054 filed on Dec. 29, 2014 with the Japanese Intellectual Property Office, the disclosure of which is incorporated herein by reference.

TECHNICAL FIELD

The present invention relates to a transparent screen and a method for manufacturing the transparent screen. More specifically, the present invention relates to a transparent screen which can clearly project and display an image without degradation of transmission visibility and a method for manufacturing the transparent screen.

BACKGROUND ART

Conventionally, a projection-type screen has been known in which image light is projected from a projector and in which moving images or still images are shown as reflected light on a screen. For example, recently in the fields of automobiles and the like, head-up displays have often been adopted in which instrument information such as speed, own-vehicle position information or the like is superimposed and displayed on the field of view of a driver, however, a problem to be solved is to achieve both transmission visibility and image visibility. In a display window such as a department store or at an event or the like, there is increasing demand to project and display images and moving images of product information, advertisement information and the like while maintaining the transparency of screens on which they are projected.

In order to cope with such a problem, for example, Patent Literature 1 discloses, as one method of an vehicle-mounted type head-up display, a display device 102 which uses a screen plate 101 subjected to half-mirror processing as shown in FIG. 6.

The screen plate 101 is formed with a half mirror (or a magic mirror) and the like which is arranged between the scene ahead and a user who visually recognizes it (in FIG. 6, the in-vehicle side of a front glass 103 of the automobile). The screen plate 101 used here is a plate the entirety of which is made translucent by uniformly forming an extremely thin reflective film over the entire surface of a transparent sheet made of, for example, glass or acrylic resin.

In the display device 102 disclosed in Patent Literature 1, since transparency is provided for light which is incident from the front of an observer in the direction of the observer (external light from the outside of the vehicle), and reflectivity is provided for light from the side of the observer (internal light within the vehicle), an image is projected from a projector 104 toward the half mirror, and thus the observer can also visually recognize the projected image while viewing the scene ahead.

As shown in FIG. 7, Patent Literature 2 discloses a reflection-type screen in which, in light diffusing layers 203 formed by vapor-depositing aluminum films 202 on black films 201, as transparent portions, through holes 204 are formed with a die-cutting device at regular intervals or randomly.

In the reflection-type screen disclosed in Patent Literature 2, since the light diffusing layers 203 and the through holes 204 which are the transparent portions are aligned at regular intervals or randomly, image light projected from a projector not shown in FIG. 7 is reflected off the light diffusing layers 203 so as to clearly show an image, and simultaneously, it is possible to visually recognize a background beyond the screen through the through holes 204.

CITATION LIST

Patent Literature

Patent Literature 1: Japanese Published Unexamined Patent Application No. 2014-206706
Patent Literature 2: Japanese Published Unexamined Patent Application No. 2006-119489

SUMMARY OF INVENTION

Technical Problem

However, in the display device disclosed in Patent Literature 1, since the entire screen plate is formed to be uniformly translucent such as a milky white color, regardless of whether or not an image is projected on the screen plate, only the portions which the observer can see through the screen plate appear darker due to translucency as compared to other portions, with the result that a feeling of discomfort occurs.

In the reflection-type screen disclosed in Patent Literature 2, the image light projected from the projector and environment light are not reflected off the portions of a large number of through holes formed on the screen at regular intervals or randomly, and thus it is possible to visually recognize the background of the screen while ensuring some degree of transparency.

On the other hand, since a light reflection layer is vapor-deposited on the black film serving as an underlying layer, the light reflection layer has excellent light shielding properties, and thus the efficiency of reflection off the light reflection layer is enhanced. However, the light reflection layer is influenced by the black film serving as an underlying layer so as to become dark as the entire background and thus, as in the display device disclosed in Patent Literature 1, only the portions which can be seen through the screen plate appear darker as compared to other portions, with the result that a feeling of discomfort occurs.

The present invention is made in view of the foregoing respects, and has an object to provide a transparent screen which can clearly project and display an image without degradation of transmission visibility and a method for manufacturing the transparent screen.

Solution to Problem

In order to achieve the above object, a transparent screen according to the present invention includes a transparent sheet, and a thin film of a metal material, which is arranged on the transparent sheet, in which a large number of equally sized regular hexagonal hole portions are formed in a web-like manner and in which, when the line width of a web-like line portion formed by connecting a side portion of one of the adjacent regular hexagonal hole portions and a side portion of the other adjacent regular hexagonal hole portion so as to have an even width with respect to each other is w and a diagonal length that halves the regular hexagonal hole portion is d, a ratio of w to d (w/d) falls within a range of 7/80 to 7/50.

Here, on the transparent sheet, the thin film in which the regular hexagonal hole portions are formed in a web-like manner is arranged, and thus it is possible to visually recognize the background of the transparent screen from the regular hexagonal hole portions through the transparent sheet while maintaining the transmission visibility. Therefore, a feeling of discomfort that only the portions which are seen through the transparent screen appear darker as compared to other portions does not occur.

Since the regular hexagonal hole portions are equal in size to each other, the transmittance of visible light which is incident on the transparent screen can be made constant over the entire transparent screen. Therefore, it is possible to realize uniform transmission visibility over the entire transparent screen.

The thin film includes the web-like line portions formed by mutually connecting the side portions of the adjacent regular hexagonal hole portions, and thus the image light projected from the projector or the like toward the transparent screen is reflected off the web-like line portions in a predetermined direction, with the result that the observer can visually recognize the image through the reflected light clearly.

Since the web-like line portions are the respective sides constituting the respective regular hexagonal hole portions, the direction of reflection of the image light is a direction at a constant angle over the entire transparent screen, and thus the image which can be visually recognized is free of unevenness, with the result that the image visibility is enhanced.

Since the web-like line portions are formed by connecting a side portion of one of the adjacent regular hexagonal hole portions and a side portion of the other adjacent regular hexagonal hole portion so as to have an even width with respect to each other, the reflectance of visible light which is incident on the transparent screen can be made constant over the entire transparent screen. Therefore, it is possible to realize uniform image visibility over the entire transparent screen.

In a relationship between the regular hexagonal hole portion and the web-like line portion, when the line width of the web-like line portion is w, and the diagonal length that halves the regular hexagonal hole portion is d, a ratio of w to d (w/d) falls within a range of 7/80 to 7/50, with the result that the transparent screen having the best balance between the transmission visibility and the image visibility can be provided.

Since the thin film is a metal material, the reflectance of the image light is increased, and thus it is possible to enhance the image visibility in a state where the transmission visibility of the transparent screen is maintained.

In a case where, in the transparent screen, the average visible light transmittance at least in a region of wavelengths of 400 to 700 nm is approximately 66 to 75%, and the average visible light reflectance at least in a region of wavelengths of 400 to 700 nm is approximately 12 to 17%, the transparent screen having the best balance between the transmission visibility and the image visibility can be provided.

In a case where the thin film is manufactured of a metallic pigment ink which contains at least aluminum and chromium, the efficiency of reflection of the image light off the thin film (web-like line portions) is enhanced, and thus it is possible to enhance the image visibility while maintaining the transmission visibility of the transparent screen.

In order to achieve the above object, a method for manufacturing a transparent screen according to the present invention includes a step of processing a transparent sheet into a predetermined shape, and a step of arranging, on the transparent sheet, a thin film of a metal material in which a large number of regular hexagonal hole portions that are equal in size are formed in a web-like manner, where the regular hexagonal hole portions are such that, when the line width of a web-like line portion formed by connecting a side portion of one of the adjacent regular hexagonal hole portions and a side portion of the other adjacent regular hexagonal hole portion so as to have an even width with respect to each other is w and a diagonal length that halves the regular hexagonal hole portion is d, a ratio of w to d (w/d) falls within a range of 7/80 to 7/50.

Here, the step of arranging the thin film includes a step of forming, on the transparent sheet, a large number of regular hexagonal hole portions in a web-like manner, and thus it is possible to visually recognize the background of the transparent screen from the regular hexagonal hole portions through the transparent sheet while maintaining the transmission visibility. Therefore, a feeling of discomfort that only the portions which are seen through the transparent screen appear darker as compared to other portions does not occur.

The step of arranging the thin film also includes a step of forming the regular hexagonal hole portions which are equal in size to each other, and thus the transmittance of visible light which is incident on the transparent screen can be made constant over the entire transparent screen. Therefore, it is possible to realize uniform transmission visibility over the entire transparent screen.

The step of arranging the thin film also includes a step of forming, on the transparent sheet, the thin film composed of the web-like line portions formed by mutually connecting the side portions of the respective adjacent regular hexagonal hole portions, and thus the image light projected from the projector or the like toward the transparent screen is reflected off the web-like line portions in a predetermined direction, with the result that the observer can visually recognize the image through the reflected light.

The step of arranging the thin film also includes a step of forming the web-like line portions by connecting a side portion of one of the adjacent regular hexagonal hole portions and a side portion of the other adjacent regular hexagonal hole portion so as to have an even width with respect to each other, and thus the reflectance of visible light which is incident on the transparent screen can be made constant over the entire transparent screen. Therefore, it is possible to realize uniform image visibility over the entire transparent screen.

The step of arranging the thin film also includes a step of forming the regular hexagonal hole portions and the web-like line portions such that when in a relationship between the regular hexagonal hole portion and the web-like line portion, the line width of the web-like line portion is w, and the diagonal length that halves the regular hexagonal hole portion is d, a ratio of w to d (w/d) falls within a range of 7/80 to 7/50, with the result that the transparent screen having the best balance between the transmission visibility and the image visibility can be provided.

In a case where the step of arranging the thin film uses a metallic pigment ink which contains at least aluminum and chromium, the efficiency of reflection of the image light off the thin film (web-like line portions) is enhanced, and thus it is possible to enhance the image visibility while maintaining the transmission visibility.

When in the step of arranging the thin film, printing is performed by a predetermined printing method, the range of choice of inks used is extended, and thus it is possible to perform printing on the transparent sheets of various sizes.

Advantageous Effects of Invention

In a case where, in a transparent screen and a method for manufacturing the transparent screen according to the present invention, it is possible to clearly project and display an image without degradation of transmission visibility.

BRIEF DESCRIPTION OF DRAWINGS

FIG. 1 is a partial front view partially showing a transparent screen according to an embodiment of the present invention.

FIG. 2 is an enlarged front view of a thin film according to the embodiment of the present invention.

FIG. 3 is a diagram showing the optical properties of the transparent screen according to the embodiment of the present invention.

FIG. 4(a) is a graph showing the visible light transmittance of transparent screens according to the embodiment of the present invention and comparative examples.

FIG. 4(b) is a graph showing the visible light reflectance of the transparent screens according to the embodiment of the present invention and comparative examples.

FIG. 5 is test pattern images projected on the transparent screens according to the embodiment of the present invention and comparative examples.

FIG. 6 is a diagram showing a conventional technique.

FIG. 7 is a diagram showing the conventional technique.

DESCRIPTION OF EMBODIMENTS

An embodiment of the present invention on a transparent screen and a method for manufacturing the transparent screen will be described below with reference to drawings for understanding of the present invention. In the respective drawings, for convenience of description, the side on which a projector is arranged is referred to as a "front surface side" and the side opposite thereto is referred to as a "back surface side."

First, FIG. 1 is a partial front view partially showing the transparent screen 1 according to the embodiment of the present invention (a state viewed from the front surface side). In FIG. 1, the transparent screen 1 is a so-called front surface projection type screen (reflection-type screen) which mainly displays an image for an observer who is present on the front surface side, and, for example, on the front surface on one side of a thin transparent sheet 2 made of plastic, a thin film 4 serving as a reflective layer in which a large number of regular hexagonal hole portions 3 that are identical to each other are opened in a web-like manner is applied.

Here, the transparent screen 1 is not necessarily the front surface projection-type screen. For example, the transparent screen 1 may be a so-called back surface projection-type screen (transmission-type screen) which mainly displays an image for an observer who is present on the back surface side. It should be noted that, although in the embodiment of the present invention, for convenience of description, the front surface projection-type screen will be described, in the case of the back surface projection-type screen, the position of the observer who is present on the "front surface side" and the position of the observer who is present on the "back surface side" are read as the "back surface side" and the front surface side," respectively.

It is not always necessary to apply the thin film 4 to only one side of the transparent sheet 2. For example, the thin films 4 may be applied to both sides of the transparent sheet 2. However, in the present invention, since the thin film is applied on the transparent sheet 2, as long as the thin film 4 is applied to only one side of the transparent sheet 2, a reflective layer equivalent to the reflective layer produced by the thin film 4 is formed on both the front surface and the back surface of the transparent screen 1.

The transparent sheet 2 has a single layer configuration which has a resin layer obtained by using only one type of highly transparent resin such as an acrylic-based resin, an acrylic urethane-based resin or a polyamide-based resin or by combining two or more types thereof.

Here, the transparent sheet 2 does not always have to have a single layer configuration. For example, the transparent sheet 2 may be formed with a plurality of layers obtained by combining, for example, a base material layer for supporting the resin layer to enhance the strength of the transparent sheet 2 and a protective layer having the function such as scratch resistance and soil resistance or the like. However, in a case where a plurality of layers are used, the material thereof is preferably selected so as not to degrade the transmission visibility and optical properties of the transparent sheet 2.

The respective regular hexagonal hole portions 3 formed, in the thin film 4, in a web-like manner are formed so as to have the same size, and, for example as shown in FIG. 2, the regular hexagonal hole portions 3 are segmented with web-like line portions 6 of a diagonal length (the longest diagonal length) d which halves the regular hexagonal hole portion 3 and a line width w formed by connecting sides 5, 5 of the adjacent regular hexagonal hole portions 3 so as to have an even width. The diagonal length d and the line width w can be changed as necessary according to the size of the transparent screen 1, the purpose of use and the like within a predetermined range which will be described later.

The thin film 4 is printed on the transparent sheet 2 by an inkjet method such that, for example, a metallic pigment ink containing metal materials such as aluminum and chromium which have luster is formed so as to be extremely thin (for example, several to several tens of micrometers or several micrometers or less).

Specifically, the transparent sheet 2 which is cut into a size corresponding to the purpose of use is set on an inkjet printer, and the metallic pigment ink containing aluminum and chromium is applied to the transparent sheet 2 so as to form a web-like pattern of the regular hexagonal hole portions 3.

Here, it is not always necessary to apply the metallic pigment ink containing aluminum and chromium to the thin film 4. For example, a metallic pigment ink which mainly contains a reflective material such as gold, copper, nickel or platinum may be applied. However, as a result of experiments repeatedly performed by the inventor, the metallic pigment ink containing silver-color metal materials, in particular, aluminum and chromium was applied to the thin film 4, and thus the efficiency of the reflection was enhanced, with the result that the best balance between the visibility of an image shown on the transparent screen 1 and the transmission visibility of the background of the transparent screen 1 was provided.

It is not always necessary to use the inkjet method for the application of the metallic pigment ink to the transparent sheet 2. For example, it is possible to adopt, as necessary, a method from various printing methods such as a screen printing method, a gravure printing method and an offset printing method.

Image light projected from a projector 7 to the transparent screen 1 is, as shown in FIG. 2, respectively reflected by the web-like line portions 6 formed in the thin film 4 at a predetermined inclination angle. The light reflected off the thin film 4 reaches, as shown in FIG. 3, the eyes of an observer X who is present on the front surface side, and thus the observer X can visually recognize a clear image.

The observer X can also visually recognize the background on the back surface side of the transparent screen 1 through the regular hexagonal hole portions 3 formed in the thin film 4. At this time, since the transparent sheet 2 uses a resin-based material which has high transparency, the background which is seen through the regular hexagonal hole portions 3 is substantially the same as a background color which is seen without the intervention of the transparent screen 1, with the result that no feeling of discomfort is given to the observer X.

Furthermore, natural light which is incident on the front surface side from the back surface side of the transparent screen 1 is irregularly reflected by the thin film 4, and the irregularly reflected light is passed through the regular hexagonal hole portions 3 also to the front surface side, with the result that an observer A can visually recognize the background more clearly.

On the other hand, part of the light reflected off the thin film 4 is also reflected to the back surface side of the transparent screen 1 through the regular hexagonal hole portions 3. Therefore, an observer Y who is present on the back surface side of the transparent screen 1 can also visually recognize the image with certain clarity, although the back surface side is inferior in visibility to the front surface side. The transmission visibility of the background which is seen by the observer Y through the transparent screen 1 is not different from that seen by the observer X.

Although the present invention will then be more specifically described using examples and comparative examples, the present invention is not limited at all to the examples.

Example 1

A transparent screen 1 was first produced in which the line width w of the web-like line portion 6 applied to the transparent sheet 2 was set to 0.14 mm and in which the diagonal length d that halves the regular hexagonal hole portion 3 was set to 1.2 mm. The results of the measurements of the visible light transmittance and the visible light reflectance of the transparent screen 1 at this time are shown in FIG. 4. Here, the visible light transmittance refers to a ratio of light which passes through the transparent screen 1 to visible light which is incident on the transparent screen 1, and the visible light reflectance refers to a ratio of light which is reflected off the transparent screen 1 to the visible light which is incident on the transparent screen 1.

As shown in FIGS. 4(a) and 4(b), the visible light transmittance of the transparent screen 1 in example 1 (reference sign A) was about 70% in a range of wavelengths from 400 to 700 nm, and the visible light reflectance was about 15% in the range of wavelengths from 400 to 700 nm.

Example 2

As in example 1, a transparent screen 1 was produced in which the line width w of the web-like line portion 6 was set to 0.14 mm and in which the diagonal length d that halves the regular hexagonal hole portion 3 was set to 1.6 mm.

At this time, as shown in FIGS. 4(a) and 4(b), the visible light transmittance of the transparent screen 1 in example 2 (reference sign B) was about 75% in the range of wavelengths from 400 to 700 nm, and the visible light reflectance was about 12% in the range of wavelengths from 400 to 700 nm.

Example 3

As in examples 1 and 2, a transparent screen 1 was produced in which the line width w of the web-like line portion 6 was set to 0.14 mm and in which the diagonal length d that halves the regular hexagonal hole portion 3 was set to 1.0 mm. At this time, as shown in FIGS. 4(a) and 4(b), the visible light transmittance of the transparent screen 1 in example 3 (reference sign C) was about 66% in the range of wavelengths from 400 to 700 nm, and the visible light reflectance was about 17% in the range of wavelengths from 400 to 700 nm.

Comparative Example 1

A transparent screen 1 was produced in which the line width w of the web-like line portion 6 was set to 0.14 mm and in which the diagonal length d that halves the regular hexagonal hole portion 3 was set to 2.0 mm. At this time, as shown in FIGS. 4(a) and 4(b), the visible light transmittance of the transparent screen 1 in comparative example 1 (reference sign D) was about 80% in the range of wavelengths from 400 to 700 nm, and the visible light reflectance was about 10% in the range of wavelengths from 400 to 700 nm.

Comparative Example 2

A transparent screen 1 was produced in which the line width w of the web-like line portion 6 was set to 0.14 mm and in which the diagonal length d that halves the regular hexagonal hole portion 3 was set to 0.8 mm. At this time, as shown in FIGS. 4(a) and 4(b), the visible light transmittance of the transparent screen 1 in comparative example 2 (reference sign E) was about 61% in the range of wavelengths from 400 to 700 nm, and the visible light reflectance was about 21% in the range of wavelengths from 400 to 700 nm.

Next, on the transparent screens 1 produced in the examples and comparative examples, test pattern images of moving images and still images were shown, the evaluation of optical properties by 20 subjects was performed and the results thereof are shown in table 1. The evaluation was performed in three stages of "good," "fair" and "poor" mainly on the transmission visibility and the image visibility.

"Good" on the transmission visibility means that the transparency of the transparent screen 1 was high, and "poor" means that the transparent screen 1 was whitish or was colored in gray or the like and that the transparency was inferior. "Good" on the image visibility means that the image shown on the transparent screen 1 was clear, and "poor" means that the image shown on the transparent screen 1 was unclear.

TABLE 1

| | Screen specifications | | | | | Evaluation | |
|---|---|---|---|---|---|---|---|
| | Thin film shape | Line width w (mm) | Diagonal length d (mm) | w/d | Trans-mittance (%) | Reflec-tance (%) | Trans-mission visibility | Image visibility |
| Example 1 | Hexagon | 0.14 | 1.2 | 7/60 | 70 | 15 | ◎ | ◎ |
| Example 2 | Hexagon | 0.14 | 1.6 | 7/80 | 75 | 12 | ○ | ◎ |
| Example 3 | Hexagon | 0.14 | 1.0 | 7/50 | 66 | 17 | ◎ | ○ |
| Comparative example 1 | Hexagon | 0.14 | 2.0 | 7/100 | 80 | 10 | ◎ | Δ |
| Comparative example 2 | Hexagon | 0.14 | 0.8 | 7/40 | 61 | 21 | X | ○ |

Notes)
Description of signs
◎: More than half of the subjects felt "good," and no subject felt "poor"
○: Less than half of the subjects felt "good," and no subject felt "poor"
Δ: Total number of subjects who felt "good" or "fair" was larger than total number of subjects who felt "poor"
X: More than half of the subjects felt "poor," and no subject felt "good"

First, in comparative example 1, since the diagonal length d that halves the regular hexagonal hole portion 3 was as long as 2.0 mm, and the area which the regular hexagonal hole portions 3 occupied in the entire transparent screen 1 was relatively large, the visible light transmittance was increased, with the result that the transmission visibility received high evaluation. On the other hand, since the total area of the web-like line portions 6 in the transparent screen 1 was relatively small, and the reflectance was lowered, the image shown on the transparent screen 1 was unclear, with the result that the image visibility received low evaluation.

Next, in comparative example 2, contrary to comparative example 1, since the diagonal length d that halves the regular hexagonal hole portion 3 was as short as 0.8 mm, and the total area which the web-like line portions 6 occupied in the entire transparent screen 1 was relatively large, the visible light reflectance was increased, with the result that the image visibility received high evaluation. On the other hand, since the total area of the regular hexagonal hole portions 3 in the transparent screen 1 was relatively small, and the transmittance was lowered, the impression that the entire transparent screen 1 was colored in gray was given, with the result that the transmission visibility received low evaluation.

It should be noted that FIG. 5 is the actual test pattern images (still images) which were checked by the subjects, and FIGS. 5(a), 5(b), 5(c), 5(d) and 5(e) show example 1, example 2, example 3, comparative example 1 and comparative example 2, respectively. As the diagonal length d is changed (that is, as the ratio between the line width w and the diagonal length d is changed), the transmittance and the reflectance are changed, and thus the transmission visibility and the image visibility on the entire transparent screen 1 are also changed.

In other words, in the present invention, the influences of the line width w of the web-like line portion 6 and the diagonal length d that halves the regular hexagonal hole portion 3 on the visible light transmittance and the visible light reflectance of the transparent screen 1 have the following relationship with respect to each other.

First, as the line width w of the web-like line portion 6 is increased and the diagonal length d that halves the regular hexagonal hole portion 3 is decreased, the area which the web-like line portions 6 occupied in the transparent screen 1 is increased (the area of the transparent portions is decreased), and thus the visible light reflectance is increased, with the result that the image visibility by the observer is enhanced. However, since the visible light transmittance is lowered, the transmission visibility of the transparent screen 1 is lowered (darkened).

On the other hand, as the line width w of the web-like line portion 6 is decreased and the diagonal length d that halves the regular hexagonal hole portion 3 is increased, the area which the transparent portions occupied in the transparent screen 1 is increased (the area occupied by the thin film 4 is decreased), and thus the transmission visibility of the transparent screen 1 is enhanced, however, the image visibility by the observer is lowered.

From the above, the transparent screens 1 in examples 1 to 3 have a good balance between the transmission visibility and the image visibility, and in particular, the transparent screen 1 in example 1 has the best balance between the transmission visibility and the image visibility.

Specifically, in the hexagonal thin film 4, the line width w of the thin film 4 and the diagonal length d are set such that the average visible light transmittance is set to 66 to 75% and is preferably set to 70% and that the average visible light reflectance is set to 10 to 17% and is preferably set to 15%, with the result that the transparent screen 1 having the best balance between the transparence visibility and the image visibility is provided. At this time, the ratio of the line width w to the diagonal length d (w/d) is 7/80 to 7/50.

As described above, with the transparent screen to which the present invention is applied and the method for manufacturing the transparent screen, it is possible to clearly project and display an image without degradation of the transmission visibility.

REFERENCE SIGNS LIST 1 transparent screen
2 transparent sheet
3 regular hexagonal hole portion
4 thin film
5 side of regular hexagonal hole portion
6 web-like line portion
7, 104 projector
X, Y observer
101 screen plate
102 display device
103 front glass
201 black film 202 aluminum film
203 light diffusing layer
204 through hole

The invention claimed is:

1. A transparent screen comprising:

a transparent sheet; and a thin film of a metal material, which is arranged on the transparent sheet, in which a large number of equally sized regular hexagonal hole portions are formed in a web-like manner and in which, when a line width of a web-like line portion formed by connecting a side portion of one of the adjacent regular hexagonal hole portions and a side portion of the other adjacent regular hexagonal hole portion so as to have an even width with respect to each other is w and a diagonal length that halves the regular hexagonal hole portion is d, a ratio of w to d (w/d) falls within a range of 7/80 to 7/50.

2. The transparent screen according to claim 1, wherein an average visible light transmittance at least in a region of wavelengths of 400 to 700 nm is approximately 66 to 75%, and an average visible light reflectance at least in a region of wavelengths of 400 to 700 nm is approximately 12 to 17%.

3. The transparent screen according to claim 1, wherein the thin film is manufactured of a metallic pigment ink which contains at least aluminum and chromium.

4. A method for manufacturing a transparent screen, the method comprising:

a step of processing a transparent sheet into a predetermined shape; and a step of arranging, on the transparent sheet, a thin file of a metal material in which a large number of regular hexagonal hole portions that are equal in size are formed in a web-like manner, where the regular hexagonal hole portions are such that, when a line width of a web-like line portion formed by connecting a side portion of one of the adjacent regular hexagonal hole portions and a side portion of the other adjacent regular hexagonal hole portion so as to have an even width with respect to each other is w and a diagonal length that halves the regular hexagonal hole portion is d, a ratio of w to d (w/d) falls within a range of 7/80 to 7/50.

5. The method for manufacturing a transparent screen according to claim 4, wherein in the step of arranging the thin the thin film is printed on the transparent sheet with a metallic pigment ink containing at least aluminum and chromium by a predetermined printing method.

* * * * *